(12) United States Patent
Porshnev et al.

(10) Patent No.: US 8,129,261 B2
(45) Date of Patent: Mar. 6, 2012

(54) CONFORMAL DOPING IN P3I CHAMBER

(75) Inventors: Peter I. Porshnev, San Jose, CA (US); Matthew D. Scotney-Castle, Morgan Hill, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/606,877

(22) Filed: Oct. 27, 2009

(65) Prior Publication Data

US 2010/0112793 A1    May 6, 2010

Related U.S. Application Data

(60) Provisional application No. 61/110,475, filed on Oct. 31, 2008.

(51) Int. Cl.
*H01L 21/265* (2006.01)
*H01L 21/302* (2006.01)
*H01L 21/322* (2006.01)

(52) U.S. Cl. . 438/513; 438/514; 438/694; 257/E21.334; 257/E21.214; 257/E21.317

(58) Field of Classification Search .......... None
See application file for complete search history.

(56) References Cited

U.S. PATENT DOCUMENTS

| | | | | |
|---|---|---|---|---|
| 4,970,580 A * | 11/1990 | Ishii | .............................. | 257/302 |
| 5,068,202 A * | 11/1991 | Crotti et al. | .................. | 438/433 |
| 5,801,082 A * | 9/1998 | Tseng | ........................... | 438/424 |
| 6,312,999 B1 * | 11/2001 | Chivukula et al. | ........... | 438/303 |
| 7,256,085 B2 * | 8/2007 | Hata et al. | ..................... | 438/201 |
| 7,314,804 B2 * | 1/2008 | Lindert et al. | ................. | 438/305 |
| 7,595,213 B2 * | 9/2009 | Kwon et al. | ..................... | 438/60 |
| 2001/0022386 A1 * | 9/2001 | Sato | .............................. | 257/565 |
| 2005/0199946 A1 | 9/2005 | Hata et al. | | |
| 2006/0088784 A1 | 4/2006 | Chen et al. | | |
| 2006/0148220 A1 | 7/2006 | Lindert et al. | | |
| 2008/0296670 A1 * | 12/2008 | Lee et al. | ...................... | 257/330 |
| 2008/0315282 A1 * | 12/2008 | Cho et al. | ...................... | 257/315 |

OTHER PUBLICATIONS

PCT International Search Report and Written Opinion dated May 25, 2010 for International Application No. PCT/US2009/062172.

* cited by examiner

*Primary Examiner* — Zandra Smith
*Assistant Examiner* — Khanh B Duong
(74) *Attorney, Agent, or Firm* — Patterson & Sheridan, L.L.P.

(57) ABSTRACT

Methods for implanting ions into a substrate by a plasma immersion ion implanting process are provided. In one embodiment, a method for implanting ions into a substrate includes providing a substrate into a processing chamber, the substrate comprising substrate surface having one or more features formed therein and each feature having one or more horizontal surfaces and one or more vertical surfaces, generating a plasma from a gas mixture including a reacting gas adapted to produce ions, depositing a material layer on the substrate surface and on at least one horizontal surface of the substrate feature, implanting ions from the plasma into the substrate by an isotropic process into at least one horizontal surface and into at least one vertical surface, and etching the material layer on the substrate surface and the at least one horizontal surface by an anisotropic process.

11 Claims, 5 Drawing Sheets

CONFORMAL DOPING IN P3I CHAMBER

CROSS-REFERENCE TO RELATED APPLICATIONS

This application claims benefit of U.S. provisional patent application Ser. No. 61/110,475, filed Oct. 31, 2008, which is herein incorporated by reference.

BACKGROUND OF THE INVENTION

1. Field of the Invention

Embodiments of the invention generally relate to the field of semiconductor manufacturing processes and devices, more particular, to methods of implanting ions into a substrate by a plasma immersion ion implantation process.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. A CMOS transistor comprises a gate structure disposed between source and drain regions that are formed in the substrate. The gate structure generally comprises a gate electrode and a gate dielectric layer. The gate electrode is disposed over the gate dielectric layer to control a flow of charge carriers in a channel region formed between the drain and source regions beneath the gate dielectric layer.

An ion implantation process is typically utilized to implant, or dope, ions into the substrate, forming the gate and source drain structure with desired profile and concentration on the substrate. During an ion implantation process, different process gases or gas mixtures may be used to provide ion source species. As the process gases are supplied into the ion implantation processing chamber (such as a P3i chamber commercially available from Applied Materials, Inc., of Santa Clara, Calif.), the gases are subjected to processes to dissociate ions, which are then accelerated toward and into the surface of the substrate. As ions accelerated to the substrate surface are typically in a linear movement, e.g., one directional movement, the ions are mostly implanted into a bottom surface of a structure, e.g., patterns or trenches, formed on the substrate surface rather than to sidewalls of the structure. Non-conformal ion doping may result in insufficient and/or non-uniform ion concentration, profile, dimension, and distribution across the substrate surface, especially in feature definitions formed in the substrate surface, thereby adversely affecting the overall electrical device performance. As critical dimensions shrink, the precision of ion implantation becomes increasingly important.

Therefore, there is a need for an improved ion implantation process to provide for a more conformal implantation of ions on a substrate surface and in feature definitions.

SUMMARY OF THE INVENTION

Methods for implanting ions into a substrate by a plasma immersion ion implantation process having a balanced etch-deposition process are provided. In one embodiment, a method for implanting ions into a substrate includes providing a substrate into a processing chamber, the substrate comprising substrate surface having one or more features formed therein and each feature having one or more horizontal surfaces and one or more vertical surfaces, generating a plasma from a gas mixture including a reacting gas adapted to produce ions, depositing a material layer on the substrate surface and on at least one horizontal surface of the substrate feature, implanting ions from the plasma into the substrate by an isotropic process into at least one horizontal surface and into at least one vertical surface, and etching the material layer on the substrate surface and the at least one horizontal surface by an anisotropic process.

In another embodiment, a method for implanting ions into a substrate includes providing a substrate into a processing chamber, the substrate comprising substrate surface having one or more features formed therein and each feature having one or more horizontal surfaces and one or more vertical surfaces, generating a plasma from a gas mixture including a reacting gas adapted to produce ions, depositing a material layer on the substrate surface and on at least one horizontal surface of the substrate feature, implanting ions from the plasma into the substrate by an isotropic process into at least one horizontal surface and at least one vertical surface, sputtering a portion of the material layer, a portion of the implanted ions, or combinations thereof, from the at least one horizontal surface to at least one vertical surface, and etching the substrate surface and the one or more horizontal surfaces and one or more vertical surfaces by an isotropic process.

In another embodiment, a method for implanting ions into a substrate includes providing a substrate into a processing chamber, the substrate comprising substrate surface having one or more features formed therein and each feature having one or more horizontal surfaces and one or more vertical surfaces, depositing a material layer on the substrate surface and on at least one horizontal surface of the substrate feature, generating a plasma from a gas mixture including a reacting gas adapted to produce ions, implanting ions from the plasma into the substrate by an isotropic process into at least one horizontal surface and into at least one vertical surface, and etching the material layer on the substrate surface and the at least one horizontal surface by an anisotropic process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention provide methods for implanting ions into a substrate by a plasma immersion ion implantation process. The invention may be used in gate structure or source/drain region formation including, but not limited to, poly doping, counter-poly doping, ultra shallow junction, and conformal doping for structures formed on a substrate, among others. The ion implantation process may be utilized in different applications, such as DRAM, logic products, and flash memory. In one embodiment, the ion implantation process is performed by supplying a gas mixture including a reacting gas, for example a boron-containing gas. A plasma is generated to dissociate ions from the gas mixture, thereby forming a source of ions that are accelerated toward and implanted into an electrically biased substrate and/or deposited as a material layer on the substrate surface. The implanted ions may also be referred to as dopants. The deposited material may be partially or completely removed to result in a dopant material disposed in the substrate surface. The deposition and removal process provides a conformal doping profile in the bottom and side wall of structures disposed in the substrate surface. Alternatively, the deposited material may be sputtered or otherwise redeposited on the substrate surface prior to the etching process. In a further alternative embodiment, the deposited material may be deposited by a separate process before ion implantation.

Figure 1A:
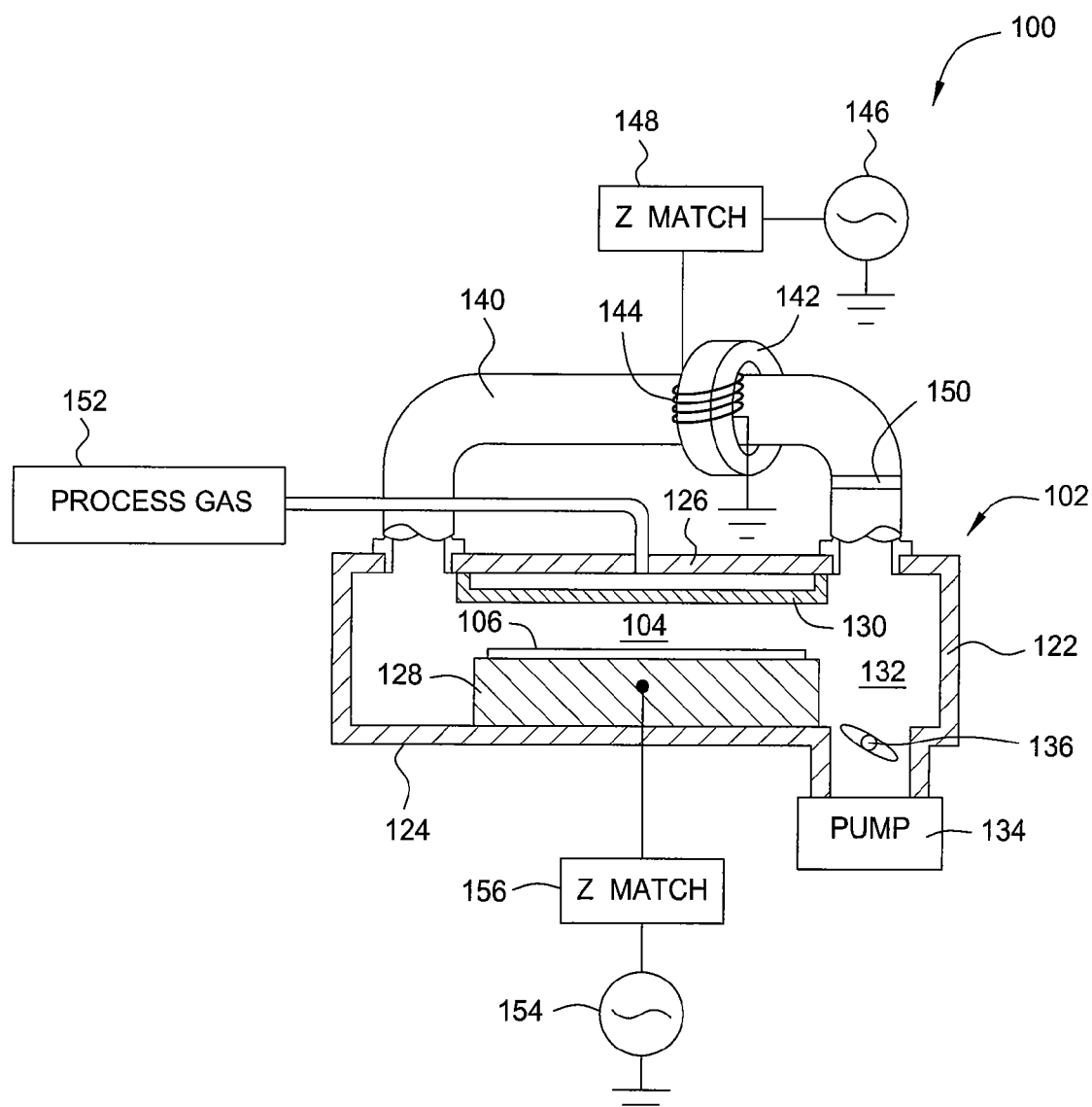
FIGS. 1A-1B depict one embodiment of a plasma immersion ion implantation tool suitable for practicing the present invention.

FIG. 1A depicts a plasma processing chamber 100 that may be utilized to practice an ion implantation process according to one embodiment of the invention. One suitable reactor chamber which the process may be practiced is a P3i™ reactor chamber, available from Applied Materials, Inc., of Santa Clara, Calif. It is contemplated that the methods described herein may be practiced in other suitably adapted plasma reactors, including those from other manufacturers. Other suitable reactor chambers include the chambers described in U.S. Pat. No. 7,094,670, issued on Aug. 22, 2006, and U.S. Pat. No. 6,494,986, issued on Dec. 17, 2002, both of which are hereby incorporated by reference to the extent not inconsistent with the recited claims and description herein.

The processing chamber 100 includes a chamber body 102 having a bottom 124, a top 126, and side walls 122 enclosing a process region 104. A substrate support assembly 128 is supported from the bottom 124 of the chamber body 102 and is adapted to receive a substrate 106 for processing. A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A gas source 152 is coupled to the gas distribution plate 130 to supply gaseous precursor compounds for processes performed on the substrate 106.

Figure 1B:
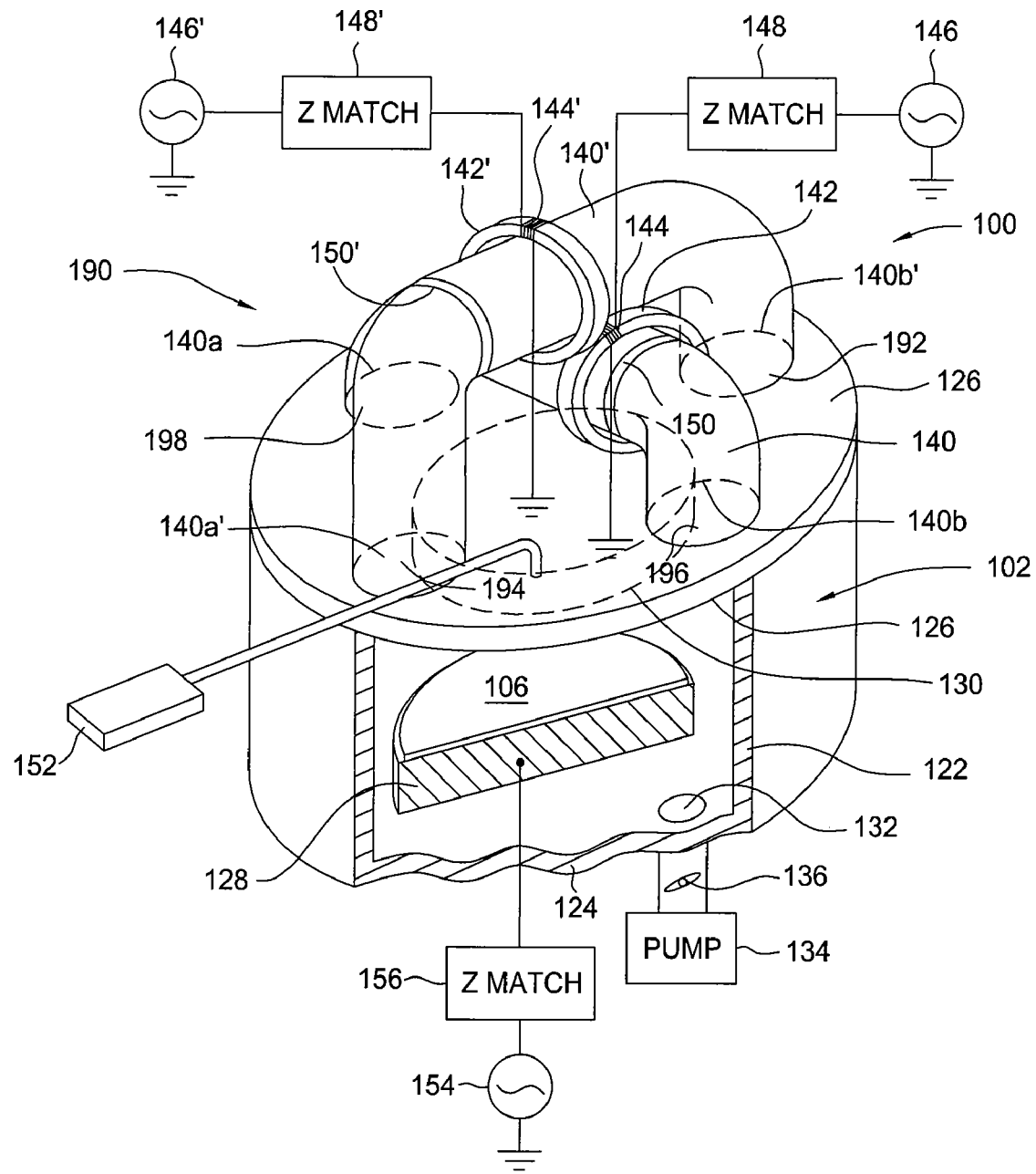

The processing chamber 100 depicted in FIG. 1A further includes a plasma source 190 best shown in the perspective view of FIG. 1B. The plasma source 190 includes a pair of separate external reentrant conduits 140, 140' mounted on the outside of the top 126 of the chamber body 102 disposed transverse to one another (or orthogonal to one another as the exemplary embodiment depicted in FIG. 1B). The first external conduit 140 has a first end 140a coupled through an opening 198 formed in the top 126 into a first side of the process region 104 in the chamber body 102. A second end 140b has an opening 196 coupled into a second side of the process region 104. The second external reentrant conduit 140' has a first end 140a' having an opening 194 coupled into a third side of the process region 104 and a second end 140b' having an opening 192 into a fourth side of the process region 104. In one embodiment, the first and second external reentrant conduits 140, 140' are configured to be orthogonal to one another, thereby providing the two ends 140a, 140a', 140b, 140b' of each external reentrant conduits 140, 140' disposed at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may have other configurations utilized to control plasma distribution in the process region 104.

Magnetically permeable torroidal cores 142, 142' surround a portion of a corresponding one of the external reentrant conduits 140, 140'. The conductive coils 144, 144' are coupled to respective RF plasma source power sources 146, 146' through respective impedance match circuits or elements 148, 148'. Each external reentrant conduits 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF plasma bias power generator 154 coupled to the substrate support assembly 128 through an impedance match circuit or element 156.

Referring back to FIG. 1A, process gases including gaseous compounds supplied from the process gas source 152 are introduced through the overhead gas distribution plate 130 into the process region 104. RF plasma source power source 146 is coupled from the power applicators, i.e., core and coil, 142, 144 to gases supplied in the conduit 140, which creates a circulating plasma current in a first closed torroidal path including the external reentrant conduit 140 and the process region 104. Also, RF plasma source power source 146' may be coupled from the other power applicators, i.e., core and coil, 142', 144' to gases in the second conduit 140', which creates a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF plasma source power sources 146, 146', which may be the same or slightly offset from one another.

In one embodiment, the process gas source 152 provides different process gases that may be utilized to provide ions implanted to the substrate 106. Suitable examples of process gases include $B_2H_6$, $AsH_3$, $PH_3$, $PF_3$, $BF_3$, and combinations thereof. The power of each plasma source power sources 146, 146' is operated so that their combined effect efficiently dissociates the process gases supplied from the process gas source 152 and produces a desired ion flux at the surface of the substrate 106. The power of the RF plasma bias power generator 154 is controlled at a selected level at which the ions formed by dissociation from the process gases may be accelerated toward the substrate surface and implanted at a desired depth below the top surface of the substrate 106 at a desired ion dose. The combination of the controlled RF plasma source power and RF plasma bias power dissociates ion in the gas mixture having sufficient momentum and desired ion distribution in the processing chamber 100. The ions are biased and driven toward the substrate surface, thereby implanting ions into the substrate in a desired ion concentration, distribution and depth from the substrate surface.

For example, with relatively low RF bias power, such as less than about 200 W, relatively low plasma ion energy may be obtained. Dissociated ions with low ion energy may be implanted at a shallow depth between about 1 Å and about 100 Å from the substrate surface. Alternatively, dissociated ions with high ion energy provided and generated from high RF bias power, such as higher than about 1,000 W, may be implanted into the substrate having a depth substantially over 100 Å from the substrate surface. Furthermore, the controlled ion energy and different types of ion species from the supplied process gases allow ions to be implanted in the substrate 106 to form desired device structures, such as gate structure and source drain region on the substrate 106.

It has been observed that the process described herein in FIGS. 2, 3A-3D and FIGS. 4, 5A-5D provides for improved conformality over prior processes. Conformality is the implantation of dopant in all surface of a feature definition and is represented by a conformality ratio. A conformality ratio is defined as a ratio of sidewall dopant dosage (i.e., dose) to the feature bottom and/or top surface dopant dose. For example, if a dopant, such as Boron, dose at the structure top surface (implant is in vertical direction, perpendicular to the wafer surface) is about $10^{16}$ atoms/cm$^2$, and the dopant dose into the structure sidewall is about $7\times10^{16}$ atoms/cm$^2$, then the conformality ratio will be about 70%. The conformality ratio may be from about 20% to about 90% by the implantation processes described herein. For example, according to the processes described herein, Boron may be implanted to a conformality from about 50% to about 90% and Arsenic may be implanted to a conformality from about 20% to about 30%.

Figure 2:
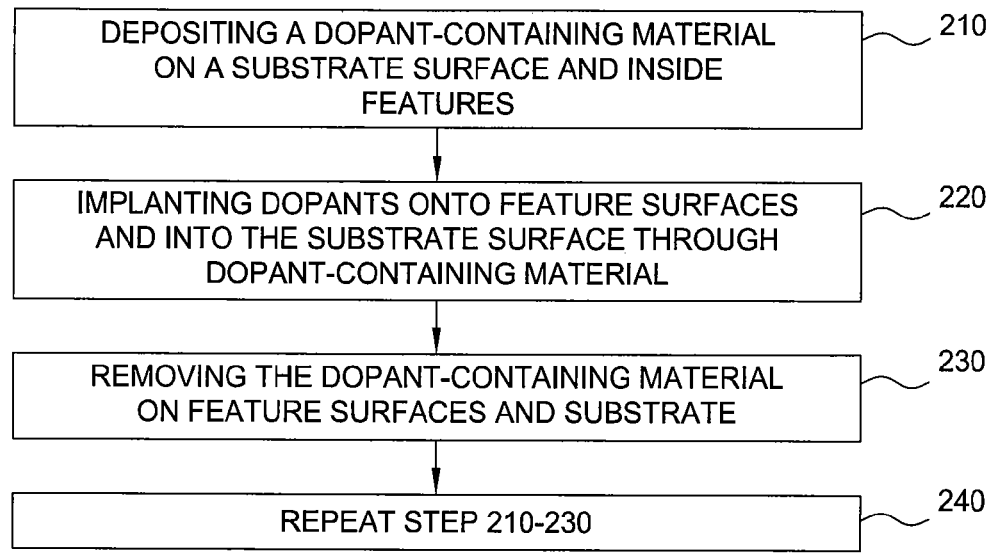
FIG. 2 depicts a process diagram illustrating a method for plasma immersion ion implantation process according to one embodiment of the present invention.

Referring to FIGS. 2 and 3A-3D, a method for implanting ions into a substrate by a plasma immersion ion implantation process is described. FIG. 2 depicts a process diagram illustrating a method for plasma immersion ion implantation process according to one embodiment of the present invention. FIGS. 3A-3D depict schematic side views of a method for plasma immersion ion implantation process according to one embodiment of the present invention.

The method may be performed in a plasma immersion ion implantation processing chamber, such as the processing chamber 100, as described in FIG. 1A-1B herein, or other suitably adapted chamber.

The method begins by providing a substrate in the processing chamber 100. In one embodiment, the substrate may be a material such as silicon oxide, silicon carbide, crystalline silicon (e.g., Si<100> or Si<111>), strained silicon, silicon germanium, doped or undoped polysilicon, doped or undoped silicon wafers, doped silicon, germanium, gallium arsenide, gallium nitride, glass, and sapphire. The substrate may have various dimensions, such as 200 mm or 300 mm diameter wafers, as well as, rectangular or square panes. Unless otherwise noted, embodiments and examples described herein are conducted on substrates with a 300 mm diameter. In embodiments where the substrate is utilized to form a gate structure, a polysilicon layer may be disposed on a gate dielectric layer on the substrate.

Figure 3A:
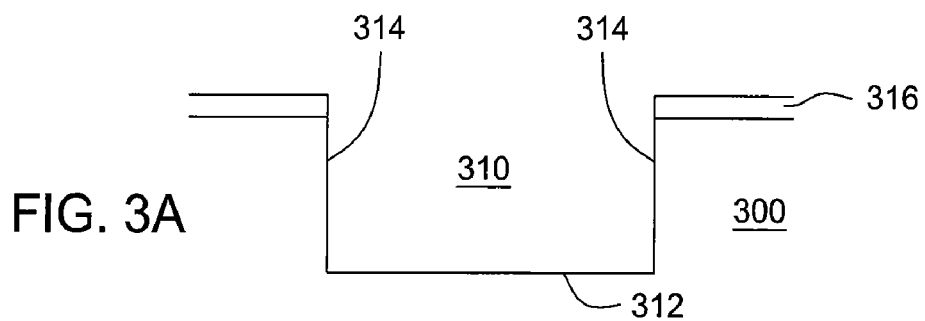
FIGS. 3A-3D depict schematic side views of a method for plasma immersion ion implantation process according to one embodiment of the present invention.

A feature 310 may be formed in the substrate 300 as shown in FIG. 3A. The feature may have one or more horizontal surfaces 312 and one or more vertical surfaces 314. The substrate 300 may comprise a material to be doped, for example, a n-type material for p-type doping or a p-type material for a n-type doping. The upper surface of the substrate surface may comprise a material 316 that may be doped for a desired structure, or may not be doped to provide dopant isolation from additional features 310.

At 210, a gas mixture is supplied into a processing chamber, such as the processing chamber 100 of FIG. 1A, that may provide a material for deposition and/or provide ion species for an implantation process. The gas mixture may be supplied from the process gas source 152 to the gas distribution plate 130, as described in FIG. 1A, or by other suitable means.

In one embodiment, the gas mixture supplied into the processing chamber includes a reacting gas. The reacting gas may provide a dopant material for deposition and/or implantation on a substrate surface and in features including boron, gallium, arsenic, phosphorous and combinations thereof, such as from conventional plasma enhanced chemical vapor deposition process. In one embodiment, the reacting gases that may be used to deposit a material layer include $B_2H_6$, $AsH_3$, $PH_3$, $PF_3$, $BF_3$, $P_2H_5$, GaN, $AsF_5$, and combinations thereof.

Figure 3B:
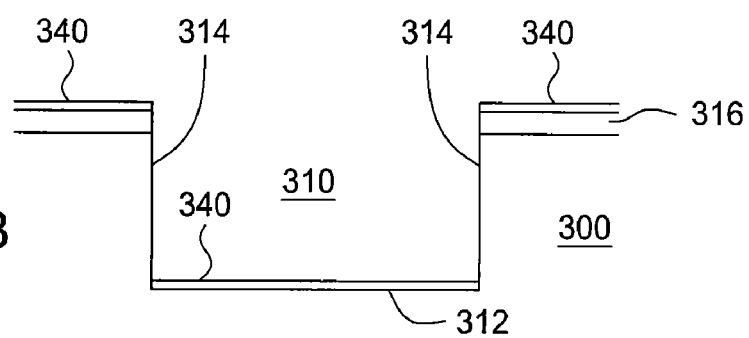

The deposited dopant-containing material layer 340 may be deposited by an isotropic or anisotropic process. FIG. 3B illustrates the deposition of the material by an anisotropic process with the material layer 340 forming predominantly on the horizontal surfaces 312 of the substrate and substrate feature 310. The dopant-containing material layer 340 may be deposited to a thickness from about 5 Å to about 1,000 Å, such as from about 50 Å to about 100 Å. The dopant-containing material layer 340 may be deposited by a plasma process, such as by an anisotropic plasma environment, from a RF discharge in a P3i chamber.

The reacting gas may also provide the desired ions to be implanted into the substrate at 220. Ions to be implanted may also be referred to as dopants or dopant species. For example, the reacting gas may provide a source of desired dopant species, such as boron, gallium, arsenic, phosphorous and combinations thereof, used to form active dopants in the electric device to produce desired electrical performance and/or physical properties of the doped region of the substrate.

Figure 3C:
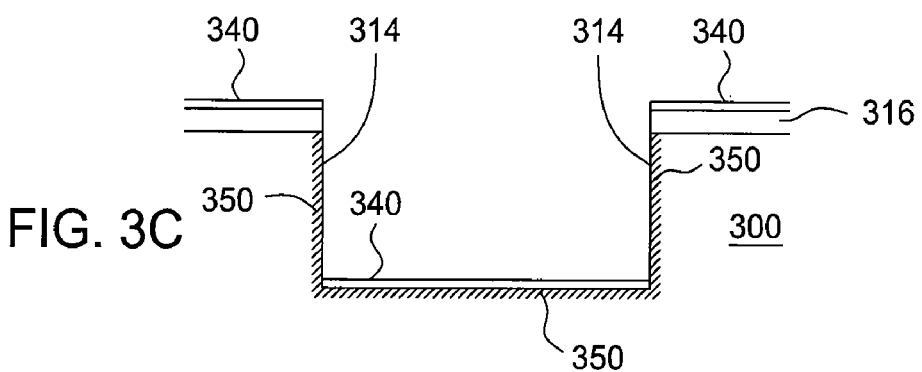

In one embodiment, the reacting gases that may be used to provide an ion specie source include $B_2H_6$, $AsH_3$, $PH_3$, $PF_3$, $BF_3$, $P_2H_5$, GaN, $AsF_5$ and combinations thereof. For example, in embodiments where the reacting gas is $B_2H_6$ gas, the $B_2H_6$ gas may be dissociated during the implantation process to produce ion species in the form of $B_2H_6^+$, $BH_2^+$ and $H^+$ ions. FIG. 3C illustrates the implantation depth of the ions/dopants 350 on the horizontal (bottom) and vertical surfaces (sidewalls) 312, 314 of substrate feature 300 by an isotropic process. The implanted dopants 350 may be implanted by a plasma process, such as an isotropic plasma ion environment, from a RF discharge of a P3i chamber.

The deposition of dopant-containing material layer 340 and ion implantation of dopants 350 may be performed at the same time, concurrently, in the same process or consecutively by one or more plasma deposition and plasma ion implantation processes. In one embodiment of the ion implantation and deposition process, the dopant-containing material layer 340 is deposited at step 210, and then the material layer is bombarded with ions, dopants, 350 at step 220 for the implantation process for the underlying substrate surface, such as shown in FIGS. 3B-3C. In another embodiment of the ion implantation and deposition process, the dopant-containing material layer 340 is deposited at step 210 and the dopants 350 are implanted at step 220 in the same process step at the same time, concurrently, such as shown in FIG. 3C without the process step shown in FIG. 3B. Both processes may be performed in situ within a processing chamber, or may be performed in situ in chambers disposed on the same processing tool, without breaking vacuum, thereby allowing for the processes to be performed during a single processing pass of the substrate.

In one embodiment of the invention, the deposited material and the implanted ions have the same element, such as boron ions in the substrate surface and a boron deposited layer on the surface thereof. Alternatively, the ions, dopant species, and the deposition material, deposition species have different elements, such as boron as the dopant species and silane as the deposition species.

At 220, an ion implantation process is performed to implant ions generated from the gas mixture into the substrate. A RF source power is applied to generate a plasma from the gas mixture in the processing chamber. The plasma is continuously generated during any flow rate changes in the gas mixture to dissociate the gas mixture as ion species and implant into the substrate. A RF bias power may be applied along with the RF source power to dissociate and drive the dissociated ion species from the gas mixture toward and into a desired depth from the substrate surface. The RF source and bias power applied to the processing chamber may be controlled at a desired energy level, thereby allowing the ion species to be dissociated and doped with a desired dosage and depth in the substrate. In one embodiment of the process described above, the ions, also known as dopants, may be implanted to a depth of less than 100 Å at dose in a range about $5 \times 10^{14}$ atoms/cm$^2$ to about $5 \times 10^{15}$ atoms/cm$^2$. The ion implantation process may result in dopant-material deposition. A concentration of dopants is represented by atoms/cm$^3$, which can be calculated from the dosage/dose of the dopants.

In one embodiment of the process, ion implantation is performed with a controlled deposition in one processing step as shown in FIGS. 3A and 3C. For such a deposition and implantation process, the source RF power may be maintained at between about 100 Watts and about 5,000 Watts. The bias RF power may be maintained at between about 100 Watts and about 10,000 Watts at a RF voltage between about 100 Volts and about 15,000 Volts. The chamber pressure may be maintained at between about 1 mTorr and about 500 mTorr. The substrate temperature may be maintained at between about 10 degrees Celsius and about 500 degrees Celsius.

In another embodiment, the gas mixture supplied into the processing chamber may include an inert gas. Examples of suitable inert gases include $N_2$, Ar, He, Xe, and Kr and the like. The inert gas in the processing chamber promotes the ion bombardment in the gas mixture, thereby efficiently increasing the probability of process gas collision, resulting in reduced recombination of ion species. The inert gas may be flowed in to the processing chamber at a rate between about 10 sccm and about 2,000 sccm, such as between about 50 sccm and about 500 sccm.

One embodiment of a concurrent deposition and implantation process includes providing a reacting gas, such as diborane ($B_2H_6$) or arsine ($AsH_3$), into the processing chamber at a flow rate from about 10 to about 1,000 sccm, such as from about 50 sccm to about 100 sccm, applying a bias at a voltage from about 200 to about 10,000 volts (V), such as from about 500 V to about 1,500 V, maintaining a chamber pressure from about 1 mTorr to about 100 mTorr, such as from about 7 mTorr to about 15 mTorr, maintaining a wafer chuck temperature from about 15° C. to about 500° C., such as from about 25° C. to about 45° C., with an implantation process at a source power from about 100 W to about 2,000 W, such as from about 200 W to about 300 W, at a duration from about 1 second to about 60 seconds, such as from about 10 seconds to about 30 seconds.

An example of such a process includes providing diborane ($B_2H_6$) into the processing chamber at a flow rate of about 50 sccm, applying a bias at a voltage of about 1,000 V, maintaining a chamber pressure of about 15 mTorr, maintaining a wafer chuck temperature of about 25° C., with an implantation process at a source power of about 200 W, at a duration of about 20 seconds. A conformality ratio of about 70% was observed for the process. The above process may also be used to both deposit the dopant-containing material layer 340 as well as implant the dopants 350.

The deposited material layer was observed to be anisotropically deposited into a horizontal portion of the substrate feature rather than into sidewalls of the substrate feature, and the ions dissociated from the gas mixture were observed to be isotropically implanted into a horizontal portion of the substrate feature and into vertical portions, sidewalls, of the substrate feature to provide for improved conformal implantation. It is believed that the dopants implanted with the deposited material layers were implanted to a more limited depth, thereby, allowing for improved conformality with the implanted dopants in the feature sidewalls. Alternatively, the dopant-containing material layer 340 may be deposited isotropically on the feature surfaces.

Figure 3D:
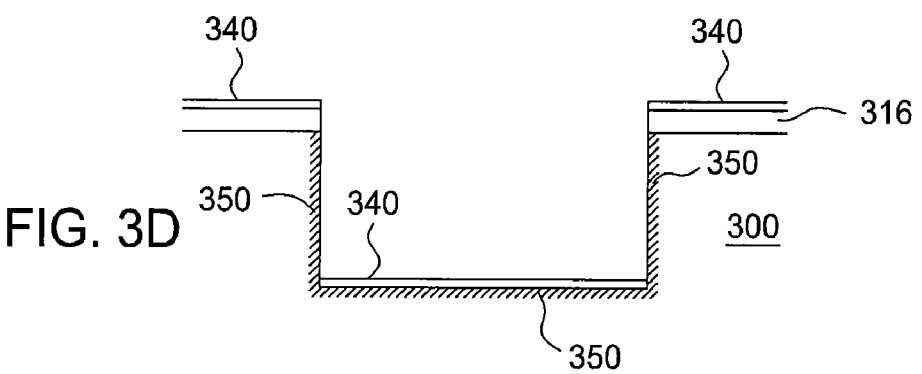

An etching process may be used to remove some or all of the dopant-containing material layer 340 deposition, and alternatively, some implanted dopants, on the horizontal portion of the substrate feature while retaining the ions implanted in the horizontal portions and vertical portions of the substrate feature at 230 as shown in FIG. 3D. The etching process may be an anisotropic etching process. However, an isotropic etching process may be used, such as when dopant-containing material layer 340 is deposited on the vertical surfaces, sidewalls, 314 of the feature definition. The etching process may be performed in situ with the deposition and/or implantation processes described herein in the same chamber or in chambers disposed on the same processing tool, without breaking vacuum, thereby allowing for the processes to be performed during a single processing pass of the substrate.

Suitable etching gases include halogen-containing compounds. Examples of etching compounds include $NF_3$, and $CF_4$. Hydrogen gas and/or inert gases may be included in the etching gas. Alternatively, a hydrogen plasma process may be used to remove the deposited material layer. In another alternative embodiment, a sputtering plasma of an inert gas may be used to remove the deposited material layer.

One embodiment of an etching process includes providing an etching gas, such as nitrogen trifluoride ($NF_3$), into the processing chamber at a flow rate from about 25 to about 1000 sccm, such as from about 50 to about 100 sccm, providing an inert gas, such Argon gas (Ar), into the processing chamber at a flow rate from about 10 to about 1,000 sccm, such as from about 100 to about 200 sccm, maintaining a chamber pressure from about 7 mTorr to about 100 mTorr, such as from about 7 mTorr to about 15 mTorr, maintaining a wafer chuck temperature from about 15° C. to about 90° C., such as from about 25° C. to about 35° C., and applying a source power from about 100 W to about 2,000 W, such as from about 200 W to about 250 W.

An example of such an etching process includes providing hydrogen ($H_2$) into the processing chamber at a flow rate of about 200 sccm, maintaining a chamber pressure of about 15 mTorr, maintaining a wafer chuck temperature of about 25° C., and applying a source power of about 500 W.

Referring to FIG. 2, operations 210-230 may be repeated or cyclically performed at 240 in one or more sequential actions to provide the desired ion implantation results. Operations 210 and 220 may be performed at the same time, concurrently, during a cycle. Operations 210-230 may be repeated from 1 to about 20 cycles, such as from about 3 to about 5 cycles.

Figure 4:
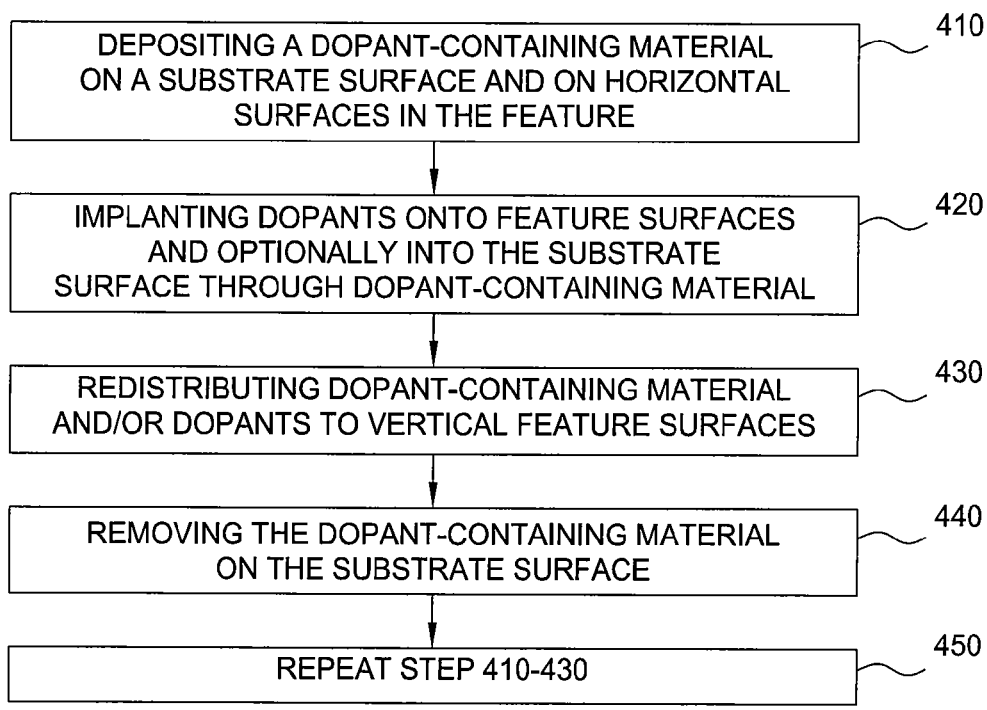
FIG. 4 depicts a process diagram illustrating a method for plasma immersion ion implantation process according to another embodiment of the present invention.

Referring to FIGS. 4 and 5A-5D, a method for implanting ions into a substrate by a plasma immersion ion implantation process is described. FIG. 4 depicts a process diagram illustrating a method for plasma immersion ion implantation process according to another embodiment of the present invention. FIGS. 5A-5D depict schematic side views of a method for plasma immersion ion implantation process according to another embodiment of the present invention.

The method may be performed in a plasma immersion ion implantation processing chamber, such as the processing chamber 100, as described in FIGS. 1A-1B, or other suitably adapted chamber.

The method begins by providing a substrate in the processing chamber. In one embodiment, the substrate 500 may be a material such as silicon oxide, silicon carbide, crystalline silicon (e.g., Si<100> or Si<111>), strained silicon, silicon germanium, doped or undoped polysilicon, doped or undoped silicon wafers, doped silicon, germanium, gallium arsenide, gallium nitride, glass, and sapphire. The substrate may have various dimensions, such as 200 mm or 300 mm diameter wafers, as well as rectangular or square panes. Unless otherwise noted, embodiments and examples described herein are conducted on substrates with a 300 mm diameter. In embodiments where the substrate is utilized to form a gate structure, a polysilicon layer may be disposed on a gate dielectric layer on the substrate.

Figure 5A:
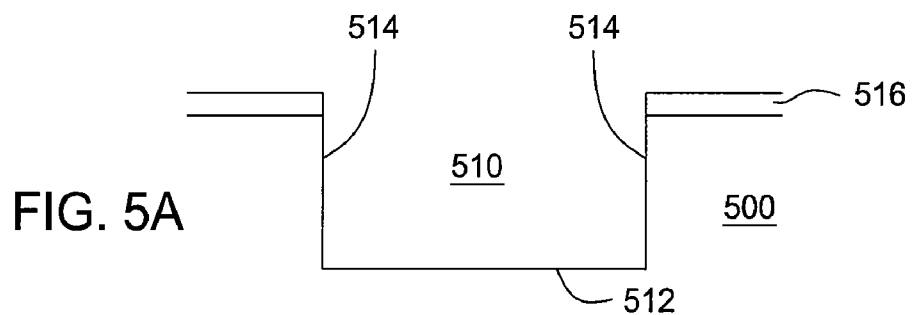
FIGS. 5A-5D depict schematic side views of a method for plasma immersion ion implantation process according to another embodiment of the present invention.

A feature definition 510 may be formed in the substrate 500 as shown in FIG. 5A. The feature may have one or more horizontal surfaces 512 and one or more vertical surfaces 514. The substrate 500 may comprise a material to be doped, for example, a n-type material for p-type doping or a p-type material for a n-type doping. The upper surface of the substrate surface may comprise a material 516 that may be doped for a desired structure, or may not be doped to provide dopant isolation of additional features 510.

At 410, a gas mixture is supplied into the processing chamber. The gas mixture may provide a material for deposition and/or provide ion species for an implantation process. The gas mixture may be supplied from the process gas source 152 to the gas distribution plate 130, as described in FIG. 1A, or by other suitable means.

In one embodiment, the gas mixture supplied into the processing chamber 100 includes a reacting gas. The reacting gas may provide a material for deposition on a substrate surface including boron, gallium, arsenic, and combinations thereof such as from a conventional plasma enhanced chemical vapor deposition process. In one embodiment, the reacting gases that may be used to deposit a material layer include $B_2H_6$, $AsH_3$, $PH_3$, $PF_3$, $BF_3$, $P_2H_5$, GaN, $AsF_5$ and combinations thereof.

Figure 5B:
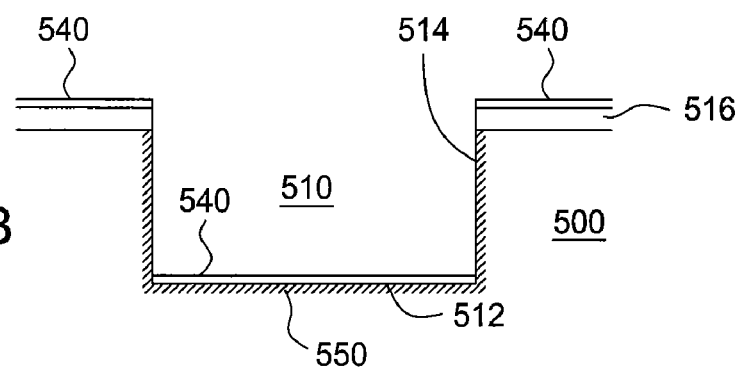

The deposited material layer 540 may be deposited by an isotropic or anisotropic process. FIG. 5B illustrates the deposition of the material by an anisotropic process with the material forming predominantly on the horizontal surfaces 512 of the substrate and substrate feature definition 510. The material 540 may be deposited to a thickness from about 5 Å to about 1,000 Å, such as from about 50 Å to about 100 Å. The deposited material 540 may be deposited by a plasma process, such as an isotropic plasma environment, from a RF discharge of a P3i chamber.

The reacting gas may also provide the desired dopants/ions to be implanted into the substrate. For example, the reacting gas may provide a source of desired ion species, such as B, P, Ga, As, and the like, used to form active dopants in the electric device to produce desired electrical performance and/or physical properties of the doped region of the substrate.

In one embodiment, the reacting gases that may be used to provide an ion specie source include $B_2H_6$, $AsH_3$, $PH_3$, $PF_3$, $BF_3$, $P_2H_5$, GaN, $AsF_5$ and combinations thereof. For example, in embodiments where the reacting gas is $B_2H_6$ gas, the $B_2H_6$ gas may be dissociated during the implantation process to produce ion species in form of $BH^{2+}$, $BH_2^+$ and $H^+$ ions.

Figure 5C:
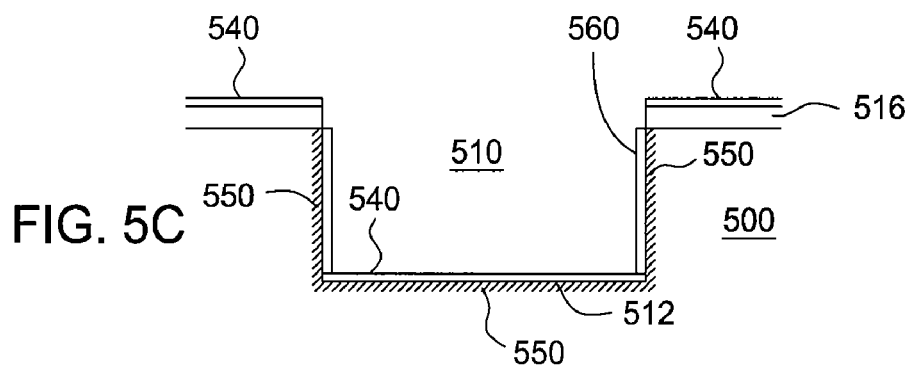

FIG. 5B illustrates one embodiment with implantation of dopants 550 with the deposited dopant-containing material 540 in the horizontal surface 512. Alternatively, no dopant implantation may occur for the deposition of the dopant-containing material 540. In a further alternative embodiment, dopants may be implanted in the vertical surfaces, sidewalls, 514 of the feature definition 510. FIG. 5C illustrates the implantation depth of the ions/dopants 550 on the horizontal and vertical surfaces 512, 514 of substrate 500 following a dopant redistribution process described herein. The ion implantation process may be an isotropic process or anisotropic process, of which isotropic is preferred for the current process. The material deposition process may be an isotropic process or an anisotropic process, of which anisotropic is preferred for the current process.

The deposition of the dopant-containing material 540 and ion implantation of the dopants 550 may be performed at the same time in the same process or consecutively by one or more plasma deposition and plasma ion implantation processes.

In one embodiment of the ion implantation and deposition process, the dopant-containing material 540 is deposited and the dopants 550 are implanted in the same process, combining operations 410 and 420 as shown in FIG. 5B, and the dopant-containing material 540, dopants 550, or combinations thereof, are redistributed at 430 as shown in FIG. 5C, such as by sputtering, to redeposit dopant-containing materials and implant dopants (or further implant dopants) in the sidewalls of the feature definition. In one such process, the dopant-containing material 540 and the dopants 550 are only formed on the horizontal surfaces of the feature definition 510. In another embodiment of the ion implantation and deposition process, the process uses alternative operation 420, wherein the dopant-containing material 540 is deposited, and then dopants 550 are implanted in sequential processes, and the material layer and dopants are redistributed, such as by sputtering, to redeposit dopant-containing materials and implant dopants (or further implant dopants) in the sidewalls of the feature definition.

In another embodiment of the ion implantation and deposition process, the dopant-containing material 540 is deposited at 410 with or without implantation at 420, and the material layer is redistributed at 430, such as by sputtering, to redistribute dopant-containing materials and implant dopants in the sidewalls of the feature definition. The dopant-containing materials and the redistribute dopant-containing materials may then be removed from the feature definition. The conformality ratio for such a process has been observed to be from about 50% to about 90%.

The dopant-containing material 540 is deposited isotropically without or with minimal implantation in the vertical and/or horizontal directions. Any dopants implantation during the deposition process may also be redistributed at 430. In one embodiment of the invention, the deposited material and the implanted ions are the same element, such as boron ions in the substrate surface and a boron deposited layer on the surface thereof.

Both the deposition and ion implantation processes may be performed in situ within a processing chamber, or may be perform in situ in chambers disposed on the same processing tool, without breaking vacuum, thereby allowing for the processes to be performed during a single processing pass of the substrate.

The dopant-containing material 540 deposition, and any implantation in such a process, may be performed by generating a plasma of a gas mixture. A RF source power is applied to generate a plasma from the gas mixture in the processing chamber. The plasma is continuously generated during the ratio change in the gas mixture supplied at to dissociate the gas mixture to deposit a material layer any may also produce ion species and implant into the substrate. A RF bias power may be applied along with the RF source power to dissociate and drive the dissociated dopant species from the gas mixture toward and into a desired depth from the substrate surface. The RF source and bias power applied to the processing chamber may be controlled at a desired energy level, thereby allowing the dopant species to be dissociated and deposited with a desired material thickness on the substrate. In one embodiment of the invention, the dopant-containing material 540 may be deposited to a thickness from about 5 Å to about 1,000 Å, such as from about 50 Å to about 100 Å, by a plasma process, such as an isotropic plasma environment, from a RF discharge of a plasma chamber, and if any implantation is performed the dopants may be implanted to a depth of less than 100 Å with dose in a range from about $5 \times 10^{14}$ atoms/cm$^2$ to about $5 \times 10^{15}$ atoms/cm$^2$.

In one embodiment of the process, ion implantation is performed with a controlled deposition in one processing step as shown in FIG. 5B. For such a deposition and implantation process, the source RF power may be maintained at between about 100 Watts and about 5,000 Watts. The bias RF power may be maintained at between about 100 Watts and about 10,000 Watts at a RF voltage between about 100 Volts and about 15,000 Volts. The chamber pressure may be maintained at between about 1 mTorr and about 500 mTorr. The substrate temperature may be maintained at between about 10 degrees Celsius and about 500 degrees Celsius.

In another embodiment, the gas mixture supplied into the processing chamber may include an inert gas. Examples of suitable inert gases include N$_2$, Ar, He, Xe, and Kr and the like. The inert gas in the processing chamber promotes the ion bombardment in the gas mixture, thereby efficiently increasing the probability of process gas collision, resulting in reduced recombination of ion species. The inert gas may be flowed in to the processing chamber at a rate between about 10 sccm and about 2,000 sccm, such as between about 50 sccm and about 500 sccm.

One embodiment of a deposition (and implantation) process includes providing a reacting gas, such as diborane (B$_2$H$_6$) or arsine (AsH$_3$), into the processing chamber at a flow rate from about 10 to about 1,000 sccm, such as from about 50 to about 100 sccm, applying a bias at a voltage from about 200 to about 10,000 volts (V), such as from about 500 V to about 1,500 V, maintaining a chamber pressure from about 1 mTorr to about 100 mTorr, such as from about 7 mTorr to about 25 mTorr, maintaining a wafer chuck temperature from about 15° C. to about 500° C., such as from about 25° C. to about 45° C., with an implantation process at a source power from about 100 W to about 2,000 W, such as from about 200 W to about 300 W, at a duration from about 1 second to about 60 seconds, such as from about 10 seconds to about 30 seconds.

An example of such a process includes providing diborane (B$_2$H$_6$) into the processing chamber at a flow rate of about 100 sccm, applying a bias at a voltage of about 1,000 V, maintaining a chamber pressure of about 15 mTorr, maintaining a chamber temperature of about 25° C., with an implantation process at a source power of about 200 W, at a duration of about 30 seconds. The conformality ratio may be about 70%.

The deposited material layer and the ions dissociated from the gas mixture tend to be predominantly deposited and implanted into a horizontal portion of the substrate feature rather than into sidewalls of the substrate feature. As the dissociated ions continue increasing in the chamber, the ions implanted into the bottom of the structure/trench may reach a saturated level while the sidewalls of the structure and/or trench may still not have a desired amount of implanted ions. Continuously supplying greater amount of ions into the chamber may result in unwanted deposition accumulated on the bottom of the substrate surface, rather than increasing the dosage, and thus, concentration, of ions implanted into the sidewall of the structure/trench.

The deposited material and implanted ions 540 may be redistributed from the horizontal surface of the substrate feature to the vertical surfaces of the substrate feature. The redistribution of dopant containing material 540 and dopants 550 may be accomplished, for example, by a resputtering process, an argon sputtering process, or combinations thereof. The redistributed dopant-containing material 560 may be deposited to a thickness of less than 100 Å, such as from 1 Å to 50 Å thick, on the vertical surfaces of the substrate feature definition 510, and the dopants and redistributed dopants may be implanted to a depth of less than 100 Å with dose in a range from about $5 \times 10^{14}$ atoms/cm$^2$ to about $5 \times 10^{15}$ atoms/cm$^2$. The conformality ratio may be from about 70% to about 90% from the redistribution after removal of the dopant-containing material 540 and redistributed dopant-containing material 560.

One embodiment of a resputtering process includes providing a sputtering inert gas, and optionally, hydrogen gas, into the processing chamber at a flow rate from about 10 to about 1,000 sccm, such as from about 100 sccm to about 200 sccm, applying a bias at a voltage from about 200 to about 7,000 volts (V), such as from about 500 V to about 1,000 V, maintaining a chamber pressure from about 7 mTorr to about 100 mTorr, such as from about 10 mTorr to about 15 mTorr, maintaining a wafer chuck temperature from about 15° C. to about 90° C., such as from about 25° C. to about 45° C., a source power from about 100 W to about 5,000 W, such as from about 200 W to about 300 W, at a step duration from about 5 second to about 50 seconds, such as from about 10 seconds to about 20 seconds. The resputtered or redeposited material may be deposited or implanted to a depth of 100 Å. The conformality ratio may be from about 70% to about 90%.

An example of such a resputtering process includes providing argon into the processing chamber at a flow rate of about 200 sccm, applying a bias at a voltage of about 1,000 V, maintaining a chamber pressure of about 7 mTorr, maintaining a wafer temperature of about 25° C., a source power of about 200 W, at a duration of about 10 seconds. The redeposited material may be deposited to a depth of 100 Å. The conformality ratio may be about 80%.

The redistribution process may be performed in situ with the deposition and/or implantation processes in situ within a processing chamber, such as the P3i chamber, or may be perform in situ in chambers disposed on the same processing tool, without breaking vacuum, thereby allowing for the processes to be performed during a single processing pass of the substrate.

Figure 5D:
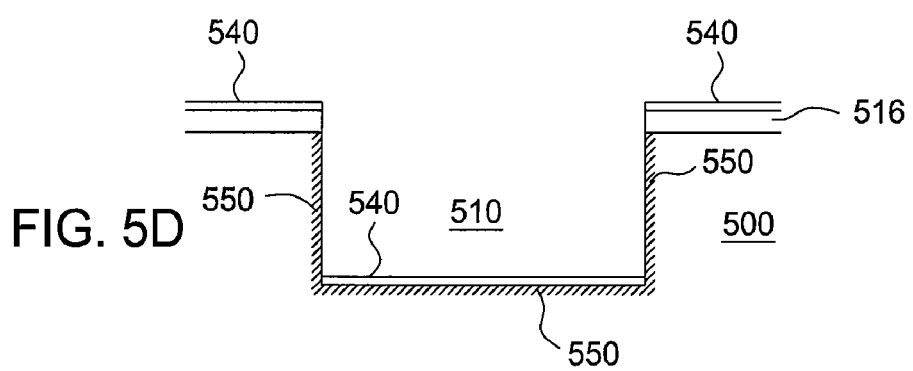

Following the redistribution process, an etching process may be used to remove some or all of the dopant-containing material 540 and the redistribute dopant-containing material 560, and alternatively, some ions, on the horizontal portion of the substrate feature while retaining the ions implanted in the horizontal portions and vertical portions of the substrate feature as shown in FIG. 5D at 440. The etching process may be an isotropic process to remove more material from the horizontal surfaces than the vertical surfaces. The etching process may be performed in situ with the deposition and/or implantation and/or redistribution processes described herein in chambers disposed on the same processing tool, without breaking vacuum, thereby allowing for the processes to be performed during a single processing pass of the substrate.

Suitable etching gases include halogen-containing compounds. Examples of etching compounds include $NF_3$, fluorocarbons, and combinations thereof. Hydrogen gas and/or inert gases may be included in the etching gas. Alternatively, a hydrogen plasma process may be used to remove the deposited material layer. In another alternative embodiment, a sputtering plasma of an inert gas may be used to remove the deposited material layer.

One embodiment of an etching process includes providing an etching gas, such as nitrogen trifluoride ($NF_3$), into the processing chamber at a flow rate from about 25 to about 1,000 sccm, such as from about 100 to about 200 sccm, or argon gas (Ar) into the processing chamber at a flow rate from about 10 to about 1,000 sccm, such as from about 100 to about 200 sccm, maintaining a chamber pressure from about 5 mTorr to about 200 mTorr, such as from about 10 mTorr to about 20 mTorr, maintaining a wafer temperature from about 15° C. to about 90° C., such as from about 25° C. to about 35° C., and applying a source power from about 100 W to about 2,000 W, such as from about 200 W to about 300 W.

An example of an etching process includes providing hydrogen gas into the processing chamber at a flow rate of about 100 sccm, maintaining a chamber pressure of about 15 mTorr, maintaining a chamber temperature of about 25° C., and applying a source power of about 500 W.

Referring to FIG. 4, operations 410-440 may be repeated or cyclically performed at 450 in one or more sequential actions to provide the desired ion implantation results. Operations 410 and 420 may be performed at the same time during a cycle. Operations 410-440 may be repeated from 1 to about 20 cycles, such as from about 3 to about 5 cycles.

Thus, methods for implanting ions into a substrate by a plasma immersion ion implanting process are provided. The improved method advantageously implants a desired amount of dopants to form a desired implanted profile on a substrate surface, thereby providing an uniform doped ion dosage cross the substrate and forming electric devices on the substrate with desired electrical performance.

While the foregoing is directed to embodiments of the present invention, other and further embodiments of the invention may be devised without departing from the basic scope thereof, and the scope thereof is determined by the claims that follow.

What is claimed is:

1. A method for implanting ions into a substrate by a plasma immersion ion implantation process, comprising:
   providing a substrate into a processing chamber, the substrate comprising a substrate surface having one or more features formed therein and each feature having one or more horizontal surfaces and one or more vertical surfaces;
   implanting ions from a plasma into the substrate by an isotropic process into at least one horizontal surface and into at least one vertical surface; and then
   etching the substrate surface and the at least one horizontal surface by an anisotropic process, wherein the method further comprises depositing a material layer on the substrate surface and on at least one horizontal surface of the one or more features of the substrate surface.

2. A method for implanting ions into a substrate by a plasma immersion ion implantation process, comprising:
   providing a substrate into a processing chamber, the substrate comprising a substrate surface having one or more features formed therein and each feature having one or more horizontal surfaces and one or more vertical surfaces;
   generating a plasma from a gas mixture including a reacting gas adapted to produce ions;
   depositing a material layer from the plasma on the substrate surface and on at least one horizontal surface of at least one substrate feature;
   implanting ions from the plasma into at least one horizontal surface and at least one vertical surface of at least one substrate feature by an isotropic process;
   sputtering a portion of the material layer, a portion of the implanted ions, or combinations thereof, from at least one horizontal surface to at least one vertical surface; and
   etching the substrate surface and the one or more horizontal surfaces and the one or more vertical surfaces by an isotropic process.

3. The method of claim 2, wherein the sputtering the implanted ions comprises exposing the substrate surface to an inert gas plasma.

4. The method of claim 2, wherein the reacting gas comprises a gas selected from the group consisting of a boron-containing gas, an arsenic-containing gas, phosphorus-containing gas and combinations thereof.

5. The method of claim 4, wherein the reacting gas comprises a gas selected from the group consisting of $B_2H_6$, $AsH_3$, $PH_3$, and combinations thereof.

6. The method of claim 2, wherein the implanting ions from the plasma, sputtering the implanted ions, and the etching the at least one horizontal surface are performed sequentially in one or more cycles.

7. The method of claim 2, wherein depositing a material from the gas mixture on the substrate surface and implanting ions from the plasma into the substrate by an isotropic process are performed concurrently.

8. The method of claim 2, wherein the ions are implanted to a depth of less than 100 Å.

9. A method for implanting ions into a substrate by a plasma immersion ion implantation process, comprising:
   providing a substrate into a processing chamber, the substrate comprising a substrate surface having one or more features formed therein and each feature having one or more horizontal surfaces and one or more vertical surfaces;
   implanting ions from a plasma into the substrate by an isotropic process into at least one horizontal surface and into at least one vertical surface; and then etching the substrate surface and the at least one horizontal surface by an anisotropic process, wherein the etching the at least one horizontal surface comprises:
   providing an etching gas selected from a halogen-containing gas; and
   generating a plasma from the halogen-containing gas.

10. The method of claim 9, wherein the etching gas further comprise an inert gas or hydrogen gas.

11. A method for implanting ions into a substrate by a plasma immersion ion implantation process, comprising:

providing a substrate into a processing chamber, the substrate comprising substrate surface having one or more features formed therein and each feature having one or more horizontal surfaces and one or more vertical surfaces;

depositing a material layer on the substrate surface and on at least one horizontal surface of the substrate feature;

generating a plasma from a gas mixture including a reacting gas adapted to produce ions;

implanting ions from the plasma into the substrate by an isotropic process and into at least one horizontal surface and into at least one vertical surface; and then etching the material layer on the substrate surface and the at least one horizontal surface by an anisotropic process.

* * * * *

UNITED STATES PATENT AND TRADEMARK OFFICE
CERTIFICATE OF CORRECTION

PATENT NO. : 8,129,261 B2
APPLICATION NO. : 12/606877
DATED : March 6, 2012
INVENTOR(S) : Porshnev et al.

Page 1 of 1

It is certified that error appears in the above-identified patent and that said Letters Patent is hereby corrected as shown below:

In the Detailed Description:

Column 5, Line 28, please delete "$7 \times 10^{16}$" and insert --$7 \times 10^{15}$-- therefor.

Signed and Sealed this
Twenty-sixth Day of June, 2012

David J. Kappos
*Director of the United States Patent and Trademark Office*